(12) United States Patent
Chen

(10) Patent No.: US 7,661,461 B2
(45) Date of Patent: Feb. 16, 2010

(54) COOLING DEVICE FOR CPU

(75) Inventor: Wei-Hau Chen, Taipei (TW)

(73) Assignee: CompTake Technology Inc., Taipei County ( * ) Notice: Subject to any disclaimer, the term of this patent is extended or adjusted under 35 U.S.C. 154(b) by 287 days.

(21) Appl. No.: 11/819,344

(22) Filed: Jun. 27, 2007

(65) Prior Publication Data
US 2008/0296001 A1 Dec. 4, 2008

(30) Foreign Application Priority Data
Jun. 4, 2007 (TW) ............................. 96209167 U

(51) Int. Cl.
H05K 7/20 (2006.01)

(52) U.S. Cl. ................. 165/80.3; 165/121; 165/104.33; 361/697

(58) Field of Classification Search ....................... None
See application file for complete search history.

(56) References Cited

U.S. PATENT DOCUMENTS

| | | | |
|---|---|---|---|
| 6,804,115 B2 * | 10/2004 | Lai ............................. 361/695 |
| 7,215,548 B1 * | 5/2007 | Wu et al. ..................... 361/703 |
| 2004/0120115 A1 * | 6/2004 | Huang et al. ................. 361/695 |
| 2004/0163798 A1 * | 8/2004 | Ghosh et al. ............ 165/104.21 |
| 2005/0225943 A1 * | 10/2005 | Shih et al. .................... 361/700 |
| 2006/0032616 A1 * | 2/2006 | Yang ...................... 165/104.33 |
| 2007/0068658 A1 * | 3/2007 | Ueda et al. ............. 165/104.33 |
| 2007/0095508 A1 * | 5/2007 | Xia et al. ............... 165/104.33 |
| 2007/0284093 A1 * | 12/2007 | Bhatti et al. ........... 165/104.33 |
| 2008/0135215 A1 * | 6/2008 | Wu ........................ 165/104.33 |
| 2008/0236790 A1 * | 10/2008 | Bhatti et al. ................ 165/80.3 |

* cited by examiner

Primary Examiner—Allen J Flanigan

(57) ABSTRACT

A cooling device includes a base connected on a CPU and a pipe unit 2 includes a plurality of absorbing pipes which are engaged with the base. A plurality of cooling pipes are connected to two ends of the absorbing pipes and extend upward in V-shape. Two cooling units are connected to the cooling pipes and each cooling unit includes fins and a cooling fan which generates air flows toward the fins and cooling the parts around the CPU.

1 Claim, 3 Drawing Sheets

COOLING DEVICE FOR CPU

BACKGROUND OF THE INVENTION (1) Field of the Invention

The present invention relates to a cooling device for removing heat from CPU and the air flows also cool other parts around the CPU.

(2) Description of the Prior Art

A conventional cooling device for removing heat generated from CPU generally includes a plurality of fins which absorb heat from the CPU and a cooling fan is cooperated to generate air flows which bring the heat away from the fins so as to quickly cool the CPU. However, the fins and the cooling fan cannot bring sufficient heat from the CPU which operates at even higher speed in the latest computer. Besides, not only the CPU needs a cooling device, there are other parts generate heat which may affect the temperature of the CPU.

The present invention intends to provide a cooling device for removing heat from CPU and includes a base connected on the CPU and a plurality of cooling pipes are connected to the base. At least one cooling unit is connected to the cooling pipes and generates air flows which blows toward the cooling pipes and other parts around the CPU.

SUMMARY OF THE INVENTION

The present invention relates to a cooling device which comprises a base connected on a CPU and a pipe unit is connected to the base by at least one absorbing pipe. At least one cooling pipe is connected to the at least one absorbing pipe and at least one cooling unit is connected to the at least one cooling pipe. The cooling unit includes fins and a cooling fan which generates air flows to bring the heat away from the fins and the cooling pipes, and other parts around the CPU.

The primary object of the present invention is to provide a cooling device for removing heat from CPU and the device includes cooling pipes on which the fins and fan are connected so as to efficiently remove heat from the CPU.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
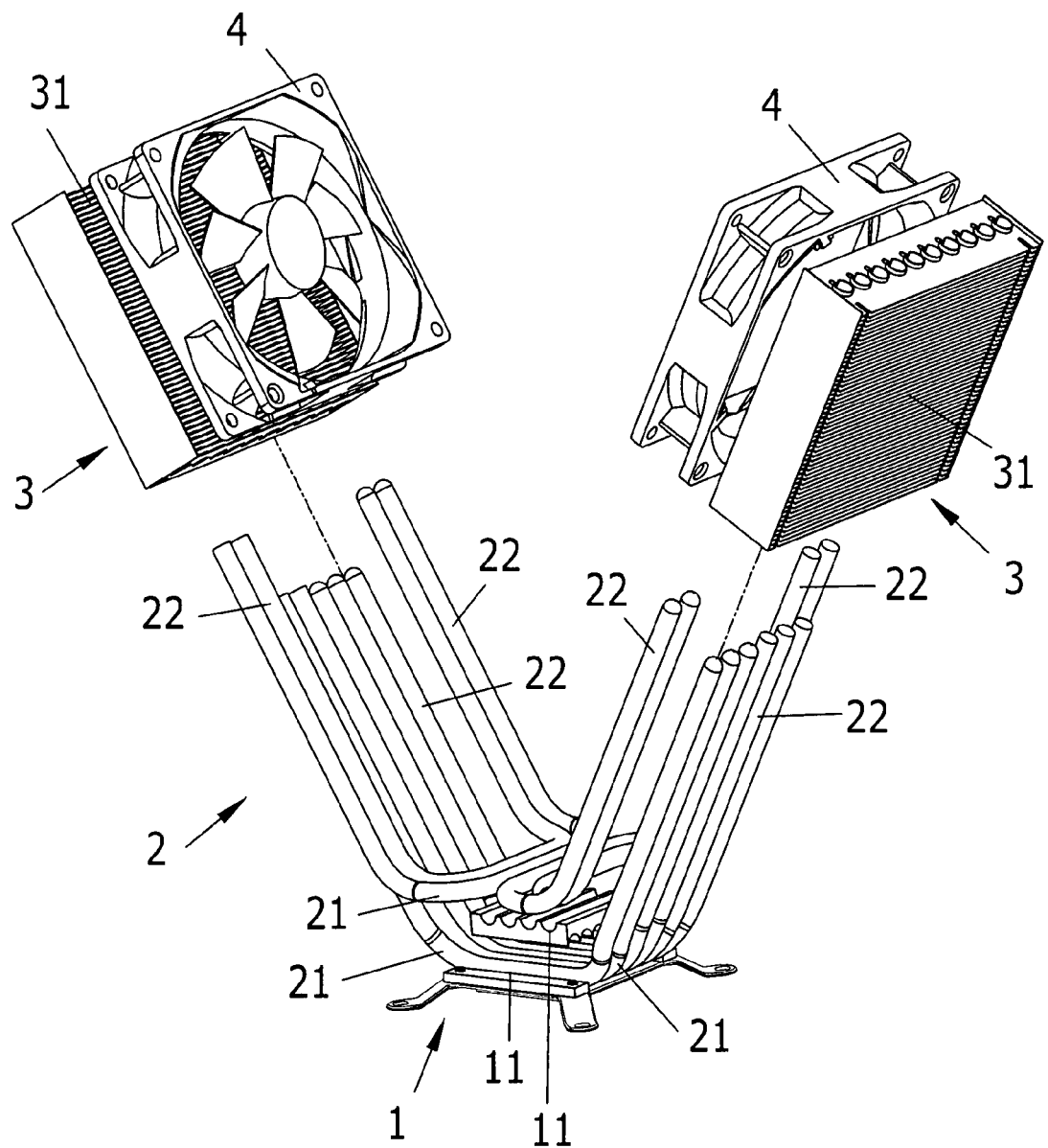
FIG. 1 is an exploded view to show the cooling device of the present invention.
Figure 2:
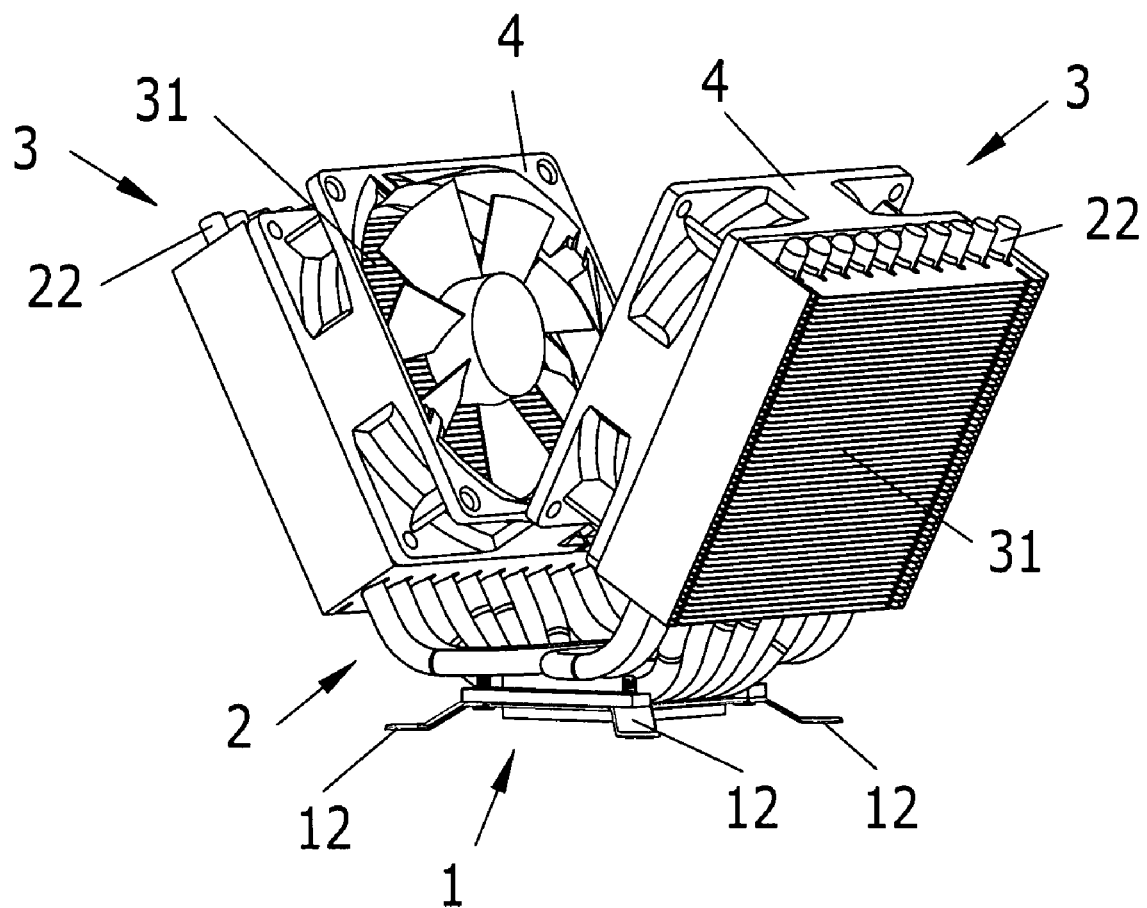
FIG. 2 is a perspective view to show the cooling device of the present invention.
Figure 3:
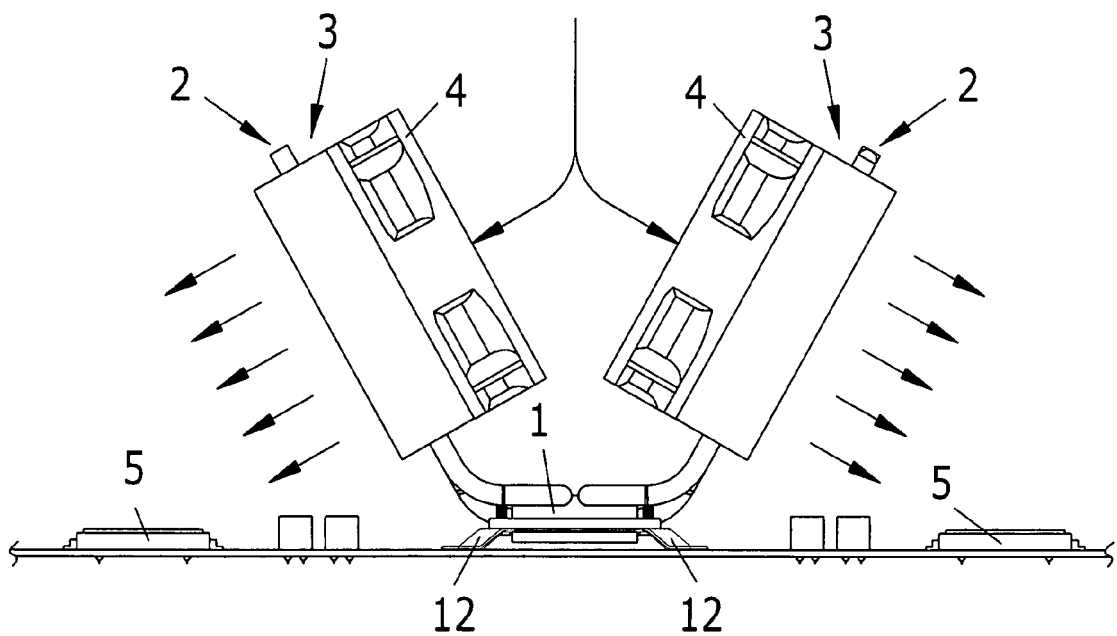
FIG. 3 shows the air flows from the fans blow through the fins and the cooling pipes and over other parts around the CPU.

Referring to FIGS. 1 to 3, the cooling device of the present invention comprises a base 1 which has fixing members 12 on four corners so as to secure the base 1 on a circuit board. The base 1 is located on a heat source such as a CPU (not shown). At least one connection member 11 is connected to the base 1 and each connection member 11 includes grooves defined therein.

At least one pipe unit 2 is connected to the at least one connection member 11 and includes absorbing pipes 21 which are engaged with the grooves of the at least one connection member 11 on the base 1. Two cooling pipes 22 are connected to two ends of each of the absorbing pipes 21 and extend in V shape. Two cooling units 3 are connected to the cooling pipes 22 and each include fins 31 and a cooling fan 4.

Further referring to FIG. 3, the heat generated from the CPU is absorbed by the absorbing pipes 21 and transferred to the cooling pipes 22 and the fins 31. The fans 4 generate air flows which blow downward at an angle and through the fins 31 and the cooling pipes 22 to remove the heat away from the CPU, the cooling pipes 22 and the fins 31. Also, the air flows blow toward other parts 5 around the CPU and are able to remove heat away from those parts 5.

The number of the cooling pipes 22 and the cooling units 3 can be adjusted according to needs, and the orientation of the cooling pipes 22 and the cooling units 3 can also be arranged to locate on four sides of the CPU. The cooling pipes 22 can also be arranged to extend through the fins 31 at different angles.

While we have shown and described the embodiment in accordance with the present invention, it should be clear to those skilled in the art that further embodiments may be made without departing from the scope of the present invention.

What is claimed is:

1. A cooling device comprising:

a base including at least one connection member which includes grooves and the base adapted to be connected on a heat source, the base including at least one fixing member which is adapted to secure the base on a circuit board;

a pipe unit including at least one absorbing pipe which is engaged with the grooves of the base and two cooling pipes connected on two ends of the at least one absorbing pipe and extending in V-shape, and two cooling units connected to the two cooling pipes and each of the two cooling units including fins and a cooling fan, the fins and the fans located at an angle relative to the circuit board.

* * * * *